United States Patent
Schelle et al.

(10) Patent No.: US 9,581,643 B1
(45) Date of Patent: Feb. 28, 2017

(54) METHODS AND CIRCUITS FOR TESTING PARTIAL CIRCUIT DESIGNS

(71) Applicant: Xilinx, Inc., San Jose, CA (US)

(72) Inventors: Graham F. Schelle, Longmont, CO (US); Yi-Hua E. Yang, San Jose, CA (US); Paul R. Schumacher, Berthoud, CO (US); Patrick Lysaght, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/924,131

(22) Filed: Oct. 27, 2015

(51) Int. Cl.
    *G06F 17/50* (2006.01)
    *G01R 31/317* (2006.01)
    *G01R 31/3177* (2006.01)

(52) U.S. Cl.
    CPC ... *G01R 31/31703* (2013.01); *G01R 31/3177* (2013.01)

(58) Field of Classification Search
    CPC .................................................. G06F 17/5036
    USPC ........................................................ 716/136
    See application file for complete search history.

(56) References Cited

U.S. PATENT DOCUMENTS

| | | | | |
|---|---|---|---|---|
| 5,448,496 A * | 9/1995 | Butts | ................... | G06F 17/5027 716/116 |
| 5,502,646 A * | 3/1996 | Chakradhar | ... | G01R 31/318586 714/726 |
| 5,640,404 A * | 6/1997 | Satish | ............ | G01R 31/318572 714/30 |
| 5,710,711 A * | 1/1998 | Cheng | ............ | G01R 31/318586 714/726 |
| 6,002,861 A * | 12/1999 | Butts | ................... | G06F 17/5027 703/15 |
| 6,056,784 A * | 5/2000 | Stanion | ................. | G06F 17/504 703/15 |
| 6,721,922 B1 * | 4/2004 | Walters | ............... | G06F 17/5022 716/102 |
| 6,907,585 B2 * | 6/2005 | Kohno | ........... | G01R 31/318594 714/738 |
| 8,196,075 B1 * | 6/2012 | Garrault | .............. | G06F 17/5036 716/104 |
| 9,183,334 B1 * | 11/2015 | Zhang | ................. | G06F 17/5045 |

(Continued)

OTHER PUBLICATIONS

Specification and drawings for U.S. Appl. No. 14/278,263, filed May 15, 2014, Schumacher et al.

(Continued)

*Primary Examiner* — Suresh Memula
(74) *Attorney, Agent, or Firm* — LeRoy D. Maunu

(57) ABSTRACT

Methods and circuits are disclosed for testing a partial circuit design including circuit modules having a set of ports configured to be driven by signals from ports of one or more circuits omitted from the partial circuit. The set of ports are identified by identifying ports that are not connected by a net to another port or input/output (I/O) pin in the circuit design and that form inputs to slave circuits in the circuit modules. A traffic generator circuit is added to the partial design to form a test circuit design. The traffic generator circuit is configured to provide to the set of ports respective input data signals having a pattern consistent with master-to-slave communication. Operation of a test circuit design is modeled. A set of data signals generated by the circuit modules during the modeled operation of the test circuit design is captured and stored.

20 Claims, 6 Drawing Sheets

(56) References Cited

U.S. PATENT DOCUMENTS

| | | | | |
|---|---|---|---|---|
| 2003/0221173 A1* | 11/2003 | Fisher | ............... | G06F 17/5022 |
| | | | | 716/106 |
| 2004/0221249 A1* | 11/2004 | Lahner | ............... | G06F 17/5022 |
| | | | | 716/102 |
| 2008/0201669 A1* | 8/2008 | Weiner | ........... | G01R 31/318547 |
| | | | | 716/132 |
| 2008/0301600 A1* | 12/2008 | Kumagai | ............ | G06F 17/5045 |
| | | | | 716/100 |
| 2010/0031209 A1* | 2/2010 | Luan | ................. | G06F 17/5031 |
| | | | | 716/113 |
| 2010/0070260 A1* | 3/2010 | Mori | ................. | G06F 17/5022 |
| | | | | 703/28 |

OTHER PUBLICATIONS

Specification and drawings for U.S. Appl. No. 14/280,211, filed May 16, 2014, Schumacher et al.

\* cited by examiner

METHODS AND CIRCUITS FOR TESTING PARTIAL CIRCUIT DESIGNS

TECHNICAL FIELD

The disclosure generally relates to testing logic circuits, and more particularly to testing partially completed circuit designs.

BACKGROUND

Programmable integrated circuits (ICs) may be programmed by a user to perform specified logic functions. One type of programmable IC, known as a field programmable gate array (FPGA), typically includes programmable resources that are arranged in an array of programmable tiles having programmable interconnects and programmable logic. The programmable interconnect typically includes a large number of interconnect lines of varying lengths interconnected by programmable interconnect points (PIPs). The programmable logic implements the logic of a circuit design using programmable elements that can include, for example, function generators, registers, arithmetic logic, and so forth. The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

During the process of developing a circuit design, the circuit design is generally tested to assess operation and performance prior to physical implementation and deployment. Testing a circuit design typically involves modeling operation of the circuit design using a software-based simulation model or emulating the circuit design on a programmable IC. In emulating a circuit design, programmable resources on a programmable IC are configured to implement the circuit design. In some implementations, operation of a circuit design may be modeled using a combination of simulation and emulation. For instance, a first circuit module of a circuit design may be simulated concurrently with emulation of a second circuit module of the circuit design. During simulation or emulation, test data is provided to the simulated/emulated circuit design and data signals are captured from various nodes of the circuit design. Data signals may be input to and captured from a simulated circuit design by a software debugging tool configured to execute a simulation model of the circuit design. In emulating a circuit design in a programmable IC, data may be input to and captured from the emulated circuit design by various circuits including, for example, an integrated logic analyzer circuit included in the programmable IC or connected to the programmable IC in an IC package, or a debugging system communicatively coupled to the programmable IC.

SUMMARY

Various example implementations are directed to circuits and methods for testing a partial circuit design including circuit modules having a set of ports configured to be driven by signals from ports of one or more circuits omitted from the partial circuit. According to an example implementation, the set of ports is determined by identifying ports that are not connected by a net to another port or input/output (I/O) pin in the circuit design and that form inputs to slave circuits in the circuit modules. A traffic generator circuit is added to the partial design to form a test circuit design. The traffic generator circuit is configured to provide to the set of ports respective input data signals having a pattern consistent with master-to-slave communication. Operation of a test circuit design is modeled. A set of data signals generated by the circuit modules during the modeled operation of the test circuit design is captured and stored.

In another embodiment, an apparatus is provided for testing a partial circuit design including circuit modules having a set of ports configured to be driven by signals from ports of one or more circuits omitted from the partial circuit. The system includes a computing arrangement having a processor and memory and configured to determine, in response to input specifying circuit modules that form the partial circuit design, the set of ports by identifying ports of the circuit modules of the partial design that are not connected by a net to another port or I/O pin in the circuit design and that form inputs to slave circuits in the circuit modules. The processor and memory are further configured to add a traffic generator circuit to the partial circuit design to form a test circuit design. The traffic generator circuit is configured to provide respective input data signals to the identified ports. The input data signals have traffic patterns characteristic of master-to-slave communication. The processor models operation of a test circuit design. The processor captures a set of data signals generated by the circuit modules during the modeled operation and stores the set of data signals in the memory.

Other features will be recognized from consideration of the Detailed Description and Claims, which follow.

BRIEF DESCRIPTION OF THE DRAWINGS

Various aspects and features of the disclosed methods and circuits will become apparent upon review of the following detailed description and upon reference to the drawings in which.

DETAILED DESCRIPTION

Figure 1:
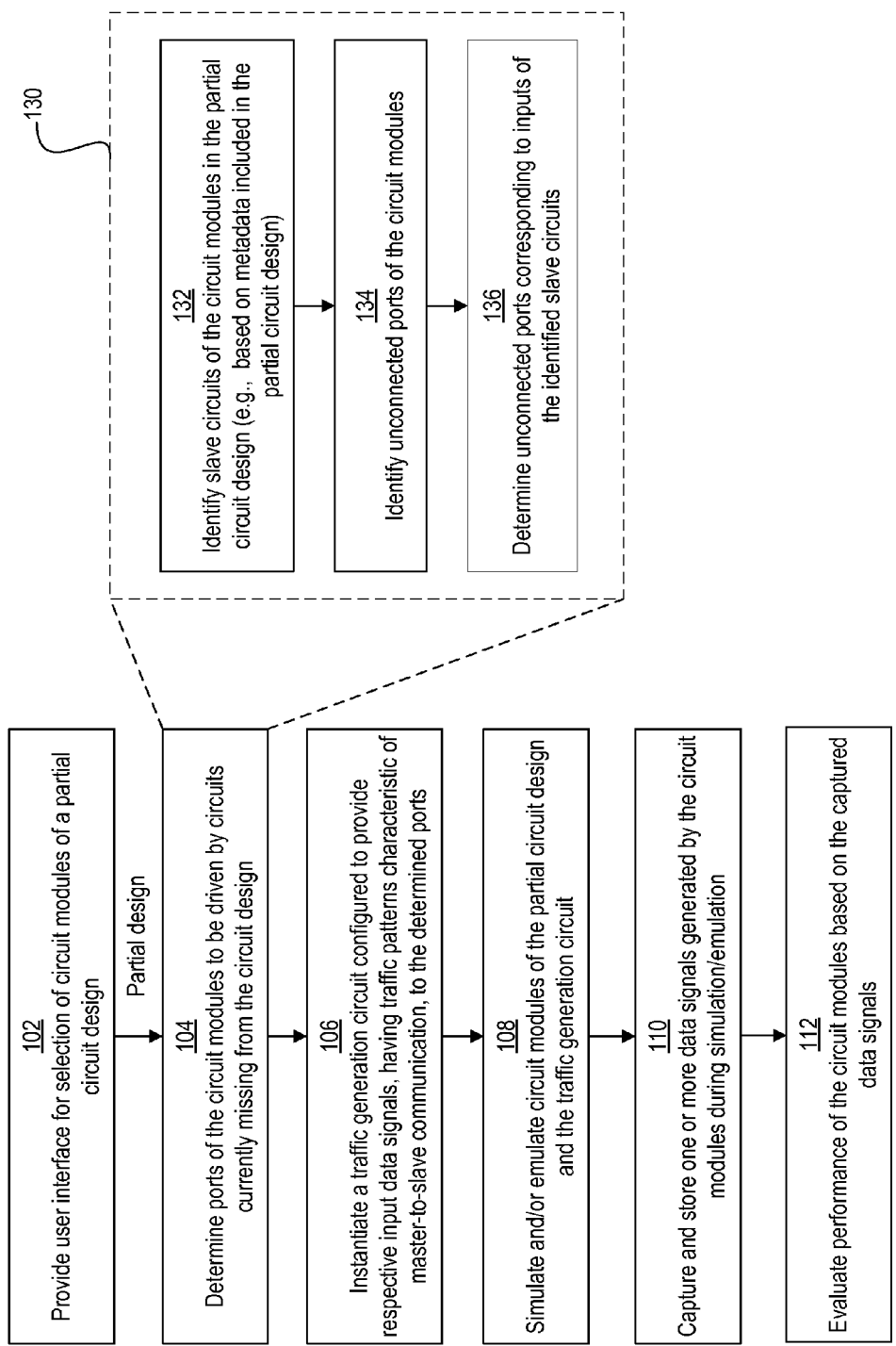
FIG. 1 shows an example process for testing a partial circuit design.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein.

Testing operation and performance of circuits is an integral part of developing circuit designs. Testing may be performed using a variety of available hardware and software based tools, which add monitoring capabilities to existing circuit designs. However, this approach requires all circuit modules in a circuit design be fully realized in order to evaluate how a circuit module interacts with other circuit modules of the circuit design. The necessity of having a fully realized design makes many tools for testing operation and/or performance unusable in the early stages of system design when many architectural decisions are made. As a result, additional development costs may be required to redesign one or more modules late in the development process after circuit modules of a circuit design are tested as a complete system.

Methods and circuits are disclosed for testing partial circuit designs. The ability to test partial circuit designs allows operation and performance to be evaluated before the design is complete. For instance, in an object oriented design process, different circuit modules may be realized at different times. The ability to test some but not all modules of a circuit design allows earlier developed circuit modules to be debugged and improved prior to completing the entire circuit design. In this manner, development time and costs may be reduced.

According to an example implementation, ports of the circuit modules in a partial design that are driven by master circuits of circuit modules omitted from the partial circuit design are identified. Ports driven by master circuits that have not been realized may be identified, for example, based on connectivity of the ports and configuration/functionality of circuit modules and/or metadata in the circuit design. For instance, ports that are unconnected to other ports or I/O pins and form inputs to slave circuits may be identified as ports driven by a circuit module omitted from the circuit design. One or more traffic generator circuits are instantiated that are configured to generate data signals for driving the identified ports in place of the omitted circuit modules. The data signals are configured to exhibit traffic patterns characteristic of master-to-slave communication. Operation of a test circuit design including the circuit modules of the partial circuit design and the traffic generator circuit is modeled using, for example, simulation and/or emulation.

A set of data signals generated by the circuit modules during the modeled operation of the test circuit design is captured and stored in a memory of the computer system. The capturing of a data signal quantizes samples of one or more analog characteristics (e.g., voltage, phase, or amplitude) of the data signal at a moment in time. Data signals may be captured from nodes in the test circuit design using various hardware or software based monitoring interfaces including, for example, a software process implemented by a debugging tool, or a monitoring circuit (e.g., an integrated logic analyzer) included in a programmable IC used to emulate the circuit design. In some implementations, a monitoring circuit may be a hardwired circuit implemented in or coupled to a programmable IC. In some other implementations, a monitoring circuit may be added to a circuit design and implemented in programmable resources of a programmable IC along with one or more circuit modules that are being emulated.

Some programmable ICs may include a processor coupled to a set of programmable logic and interconnect resources. The programmable logic and interconnect resources may be configured to implement a hardware portion of a circuit design and the processor may be configured to implement a software portion of a circuit design. In some implementations, the processor may be programmed to monitor a set of signals of the circuit design.

In some implementations, the captured data signals are provided to a software-based debugging tool. The debugging tool may be configured to, for example, create a graphical waveform representation of the data signals for visual inspection and/or analysis by a user. In some implementations, the debugging tool is configured to analyze the captured data signals to assess various performance metrics for one or more of the circuit modules. Performance metrics may include for example, latency, timing slack, power consumption, signal jitter, clock jitter, throughput, byte count, beat count, idle cycles, size of data transfers, or combinations thereof.

Alternatively or additionally, the debugging tool may identify various events in the captured data signals to assist visual analysis by a user. For instance, the debugging tool may identify start and endpoints of transactions in the captured data signals or trace data transactions across heterogeneous protocol interfaces. As one example, the start position of an AXI data transaction can be identified by the assertion of a VALID or READY signal. The end position of an AXI read transaction can be identified by an RLAST signal being asserted and cleared. The end position of an AXI write transaction can be identified by a WLAST signal being asserted followed by a BRESP being asserted. In some implementations, the debugging tool may also generate graphical indications of performance metrics for one or more circuit modules and/or captured data signals.

Additionally or alternatively, the debugging tool may be configured to evaluate one or more of the captured data signals for compliance with one or more communication protocols including, but not limited to, those of the Advanced Microcontroller Bus Architecture (AMBA) Advanced Extensible Interface (AXI), Peripheral Component Interconnect Express (PCIe), Universal Serial Bus (USB), IEEE1394, and/or Serial Attached SCSI. Protocol violations that may be detected depend on requirements/limitations of data transactions specified by the communication protocol. As one example, the AXI protocol requires the length of a fixed burst mode transaction to be no more than 16 beats. A beat refers to a single transmission cycle for communication on the data bus. A burst-mode transaction may transmit a number of data transactions over a number of sequential data beats that does not exceed 16 beats. As another example of an AXI violation, ARADDR, ARBURST, ARCACHE, ARID, ARLEN, ARLOCK, ARPROT, ARSIZE, ARQOS, and ARREGION signals must remain stable when an ARVALID signal is asserted and an ARREADY signal is low. In some implementations, the debugging tool may also generate graphical indications of protocol compliance for one or more circuit modules or captured data signals. For instance, graphical representations of the captured data signals may be supplemented to identify locations and types of detected protocol violations.

In some implementations, the debugging tool may include a graphical user interface (GUI) for selecting circuit modules to be tested as a partial circuit design. Similarly, the debugging tool may include a GUI for selecting or adjusting traffic patterns to be generated for identified ports by traffic generation circuits. In some implementations, the GUI may display a list of suggested traffic patterns for the identified ports based on metadata in the partial circuit design. Metadata may determine master-slave protocols used by the circuit modules to receive data via the identified ports and suggest traffic patterns for the determined protocols. For instance, naming and/or configuration of circuit modules and/or ports may indicate the communication protocol used for communication via the port. In response to input via the GUI, the debugging tool instantiates traffic generation circuits configured to generate data signals with the selected traffic patterns. Traffic generation circuits may be instantiated, for example, by retrieving circuits from a library having respective traffic generation circuits for a plurality of communication protocols. The retrieved circuits may be added to a test circuit design along with the circuit modules of the partial circuit design.

In some implementations, a debugging tool may be configured to model circuit modules of a partial circuit design and/or traffic generator circuits using a combination of simulated circuit modules, emulated circuit modules and/or ASIC implemented circuit modules. For example, a first set of circuit modules may be simulated in a software based simulation model and a second set of circuit modules may be emulated on a target programmable IC. In various implementations, the traffic generator circuits are configured to provide consistent input/output behavior regardless of whether a traffic generator circuit is implemented as a simulated circuit, as an emulated circuit, or as an ASIC.

In some implementations, a debugging tool may adjust the manner in which a circuit module is modeled in further testing of a partial circuit design based on analysis of captured data signals and/or status of circuit modules in the partial circuit design. For example, when a new circuit module is developed and added to a partial circuit design, the debugging tool may initially model and test the circuit module via simulation. If data signals captured during simulation indicate that the circuit module is operating correctly and exhibits required performance, the debugging tool may emulate the circuit module in the next round of testing. Similarly, if simulation and emulation both indicate that a circuit module is operating and performing as expected, the circuit module may be implemented as an ASIC for further testing. Conversely, if a user modifies a circuit module to correct a problem or add additional features, the debugging tool may return to testing the circuit module via simulation.

Additionally or alternatively, in some implementations, the debugging tool may be configured to adjust selected traffic patterns based on analysis of captured data signals and/or status of circuit modules in the partial circuit design. For example, if testing a circuit design with a first set of traffic patterns indicates correct operation, the debugging tool may repeat testing of the circuit design using a second set of test patterns.

In some implementations, a debugging tool may be configured to model and test circuit modules of a partial circuit design in multiple test platforms (e.g., software engines for simulation or programmable ICs for emulation) and compare testing results. Testing in multiple platforms may be useful to verify consistency of operation and testing of the circuit modules. Testing in multiple platforms may also be useful to assess performance of the circuit design implemented in various target programmable ICs. The debugging tool may compare testing results of different test platforms to determine a programmable IC having the best performance for the partial circuit design.

As previously discussed, in some implementations, the debugging tool may configure modeling and testing of circuit modules based on metadata included in the circuit design. Metadata may be indicated, for example, by naming of elements in the circuit design or by configuration data of circuit modules, such as configuration settings for intellectual property cores. Metadata may also include data for scheduling partial reconfiguration of programmable resources to implement different circuit modules at different times. In some implementations, the debugging tool is configured to simulate load and eviction times for partial reconfiguration of programmable resources in a target programmable IC based on the metadata.

In some implementations, the debugging tool may be configured to pass metadata between testing platforms to facilitate testing in different test platforms without significant reconfiguration. For instance, metadata indicating identified ports and/or selected traffic patterns may be provided to a new test platform for reuse.

Turning now to the figures, FIG. 1 shows an example process for testing a partial circuit design. At block 102, a user interface is provided for selection of circuit modules of a partial circuit design for testing. At block 104, ports of the circuit modules to be driven by circuits currently missing from the circuit design are determined. Block 130 shows an example process for determining ports intended to be driven by circuits currently missing from the partial circuit design. In this example, slave circuits of the circuit modules in the partial circuit design are identified at block 132. Slave circuits may be identified, for example, based on metadata included in the partial circuit design. Metadata indicative of a slave circuit may include, for instance, names or configuration settings of circuit modules. At block 134, unconnected ports of the circuit modules of the partial circuit design are identified. Unconnected ports are not connected by a net to a port of another module or to a designated input/output pin of the circuit design. At block 136, unconnected ports corresponding to inputs of the identified slave circuits are determined.

At block 106, one or more traffic generation circuits are instantiated by generating or retrieving circuit descriptions of the traffic generation circuits and adding the circuit descriptions to the partial design. The traffic generation circuits are configured to provide respective input data signals to the ports identified at block 104. The input data signals have traffic patterns characteristic of master-to-slave communication (e.g., patterns of communications from an AXI master to an AXI slave). At block 108, operation of traffic generation circuits and the circuit modules of the partial circuit design are simulated and/or emulated. As previously described, in some implementations, a monitoring circuit may be added to the partial circuit design as part of the simulation/emulation for capturing data signals. At block 110, one or more data signals generated by the circuit modules during operation are captured and stored. At block 112, performance of the circuit modules of the partial design is evaluated based on the captured data signals.

Figure 2:
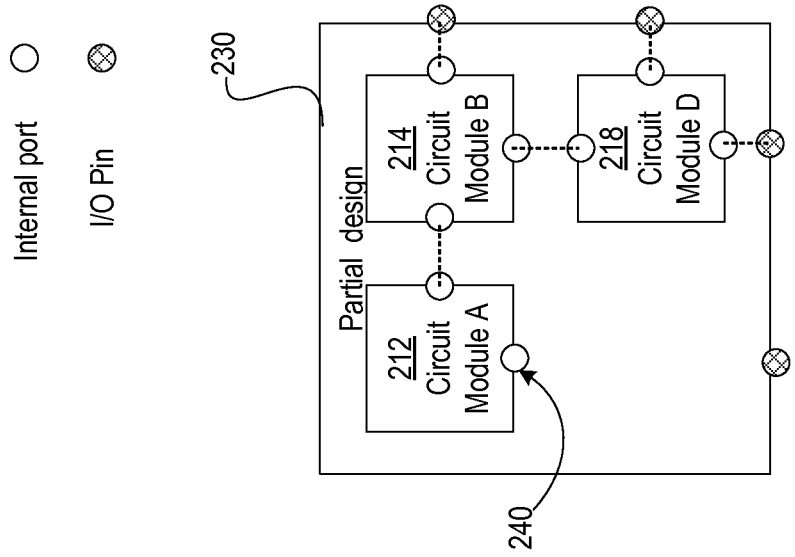
FIG. 2 shows an example set of circuit modules for a partial circuit and a completed circuit.
Figure 2:
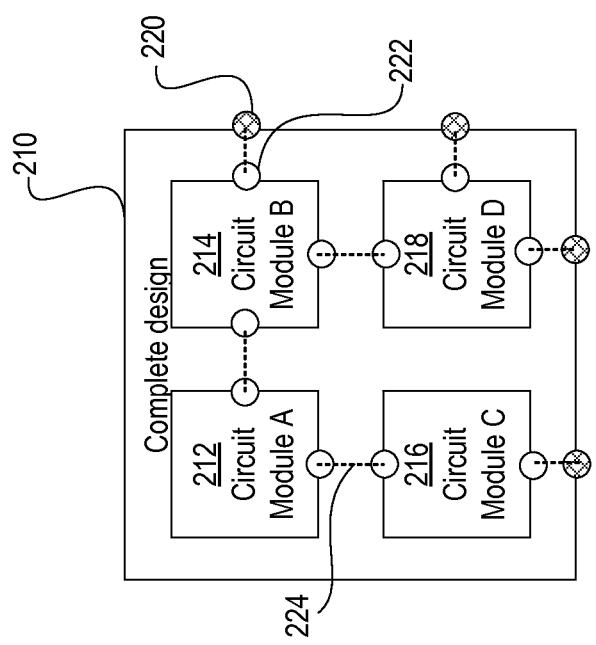

FIG. 2 shows example circuit module arrangements for complete and partial circuit designs. FIG. 2 shows a first arrangement 210 of circuit modules for a complete object-oriented circuit design. The first arrangement 210 includes a plurality of circuit modules 212, 214, 216, and 218. The circuit modules specify high-level functionality and ports (e.g., 222) of circuit modules to be implemented for a design. Each port of the circuit modules may be connected by a net (e.g., 224) to ports or to input/output pins 220 of the circuit design. Functionality and ports of circuit modules and net connections between ports for a complete circuit design may be specified for example in a template for an object-oriented circuit design. FIG. 2 also shows a second arrangement 230 of circuit modules for a portion of the circuit arrangement shown in first arrangement 210. In this example, the arrangement 230 includes circuit modules 212, 214, and 218. A circuit module definition is not specified in the arrangement 230 for the module definition 216, which is specified in the complete design 210. Due to the absence in partial design 230 of the module definition 216, port 240 is unconnected in the partial design. As previously described, if the port 240 corresponds to an input of a slave circuit in circuit module 212, a traffic generation circuit (not shown) may be added to the partial design 230 to provide a data signal having a master-to-slave traffic pattern to port 240.

Figure 3:
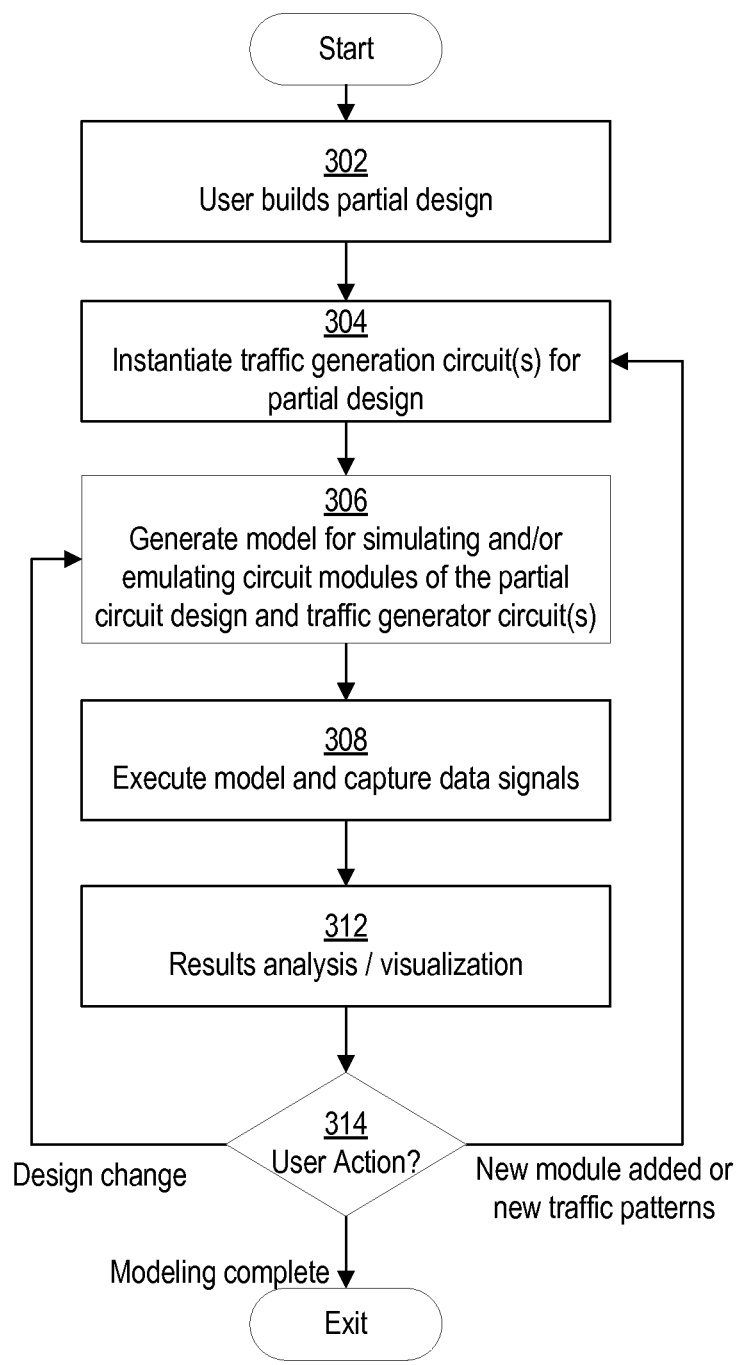
FIG. 3 shows a process for an example design flow consistent with one or more implementations.

FIG. 3 shows a process for an example design flow, consistent with one or more embodiments. A partial circuit design is built by a user at block 302. Traffic generation circuits are instantiated for the partial design at block 304. At block 306, a model is generated for simulating and/or emulating operation of circuit modules of the partial circuit design and the traffic generator circuit(s). At block 308, the generated model is executed and data signals are captured. At block 312, results analysis is performed and a visualization of results and/or waveforms is generated.

Based on results of the analysis, a user may perform a number of different actions. For example, a user may decide to make changes to one or more circuit modules or perform additional testing using different traffic patterns. If one or more circuit modules are changed, decision block 314 directs the process back to block 306 to generate a new module for simulation and/or emulation of the partial circuit design and existing traffic generation circuits. If the user selects to continue testing with different test patterns, decision block 314 directs the process back to block 304 to update/modify traffic generation circuits to generate the new test patterns. If one or more new circuit modules are added to the partial circuit design, decision block 314 directs the process back to block 304 to update/modify one or more traffic generation circuits based on the circuit modules added to the partial circuit design. For instance, the new circuit module may include a slave circuit requiring an additional traffic generator. Additionally or alternatively, the new circuit module may include a master circuit, which can replace one or more of the existing traffic generators. If modeling is completed, decision block 314 directs the process to exit.

Figure 4:
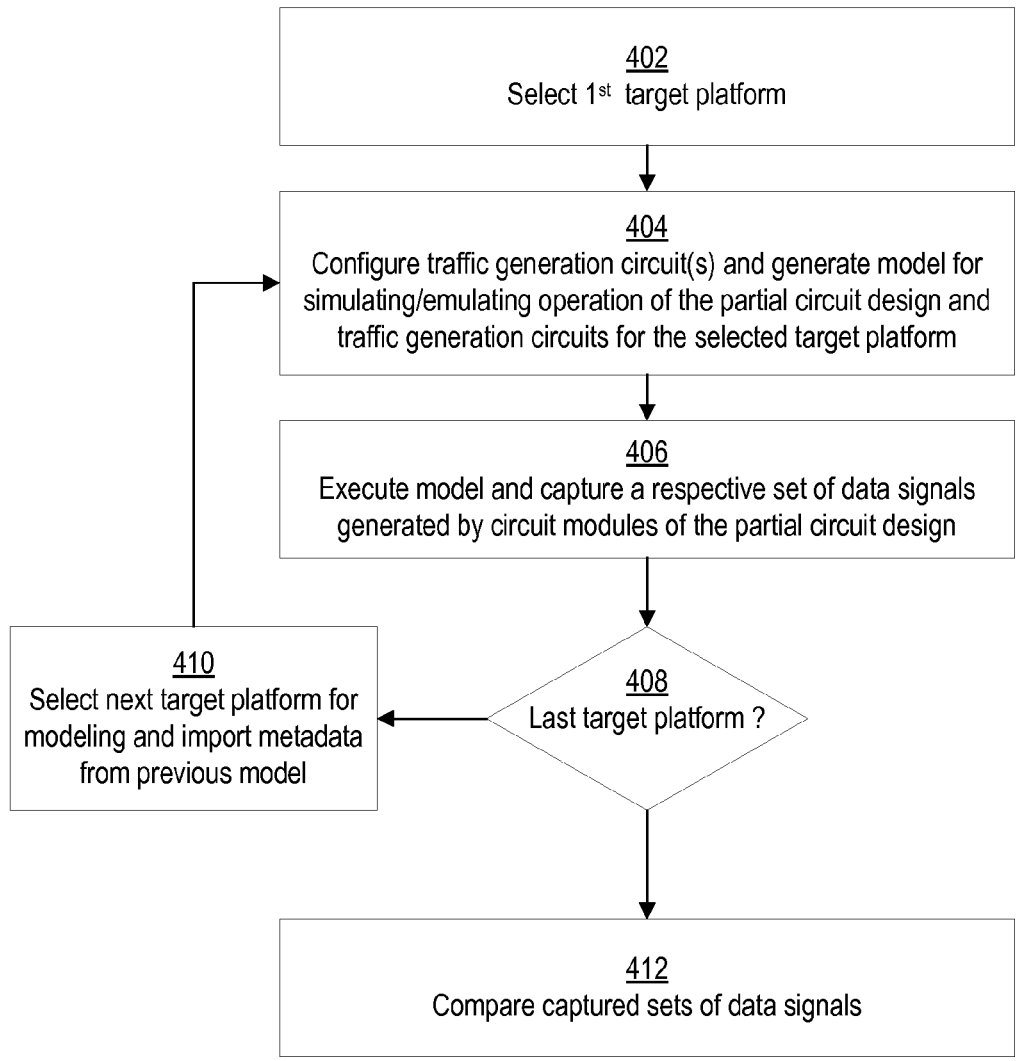
FIG. 4 shows an example process for modeling a partial circuit design for implementations in various target platforms.

FIG. 4 shows an example process for modeling a partial circuit design for implementations in various target platforms. Target platforms may include, for example, various programmable IC or ASIC lithography options for implementation of the circuit design. A first target platform is selected at block 402. At block 404, traffic generation circuit(s) are configured and a model is generated simulating and/or emulating operation of the partial circuit design and traffic generation circuits on the selected platform. At block 406, the generated model is executed and a set of data signals generated by the circuit modules is captured. If the selected platform is not the last platform to be tested, decision block 408 directs the process to block 410. At block 410, the next target platform is selected for modeling and metadata from the previous model is imported. After selecting the next platform, the process returns to block 404 and repeats modeling of the circuit design for the selected platform. If the selected platform is the last platform to be tested, decision block 408 directs the process to block 412. At block 412, the captured sets of data signals are compared, for example, to verify consistent operation and modeling of the circuit design for various target platforms, or to determine the target platform providing best performance for the partial design.

Figure 5:
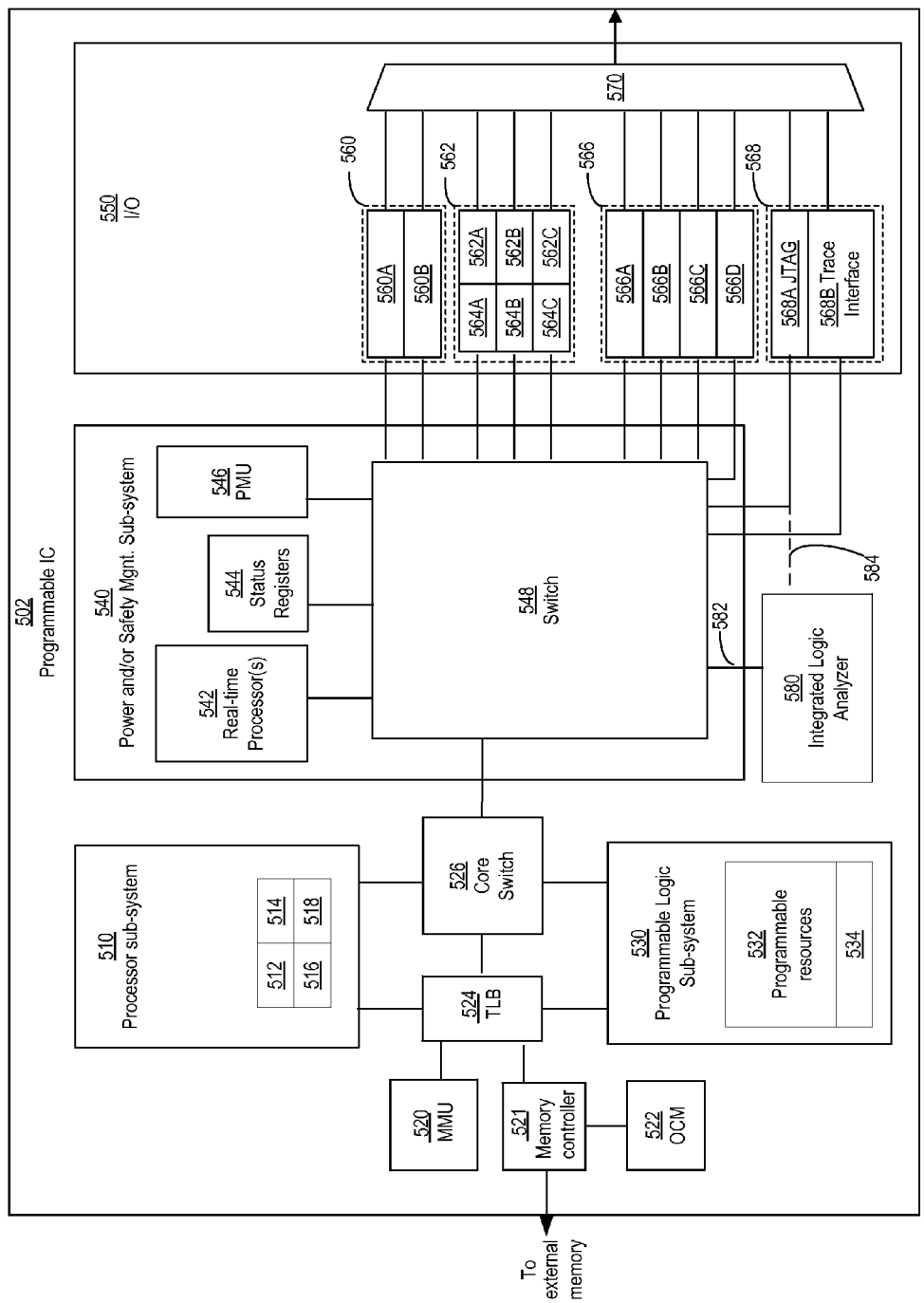
FIG. 5 shows an example programmable IC having an integrated logic analyzer circuit, in accordance with one or more implementations.

FIG. 5 shows a programmable IC 502 having an integrated logic analyzer circuit 580 for capturing data signals of circuit modules implemented in programmable logic consistent with one or more implementations. The programmable IC may also be referred to as a System On Chip (SOC), which includes a processor sub-system 510 and a programmable logic sub-system 530. In this example, the programmable IC also includes a sub-system 540 having various circuits for power and/or safety management and an input/output (I/O) sub-system 550 for communication of data with external circuits. The subsystems 510, 530, 540, and 550 may be formed using a plurality of semiconductor dies, and interconnected in an IC package as described in the above examples.

The processing sub-system 510 may be programmed to implement a software portion of the circuit design, via execution of a user program. Alternatively or additionally, the program may implement one or more traffic generators configured to generate data signals to one or more ports of a partial circuit design implemented in programmable resources 532. The program may be specified as part of a configuration data stream or may be retrieved from an on-chip or off-chip data storage device. The processing sub-system 510 may include various circuits 512, 514, 516, and 518 for executing one or more software programs. The circuits 512, 514, 516, and 518 may include, for example, one or more processor cores, floating point units (FPUs), an interrupt processing unit, on chip-memory, memory caches, and/or cache coherent interconnect.

The programmable logic sub-system 530 of the programmable IC 502 may be programmed to implement a partial circuit design and traffic generation circuits as previously discussed. For instance, the programmable logic sub-system may include a number of programmable resources 532, which may be programmed to implement a set of circuits specified in a configuration data stream. The programmable resources 532 include programmable interconnect circuits, programmable logic circuits, and configuration memory cells. The programmable logic implements the logic of a circuit design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 532 may be programmed by loading a configuration data stream into the configuration memory cells, which define how the programmable interconnect circuits and programmable logic circuits are configured. The collective states of the individual memory cells then determine the function of the programmable resources 532. The configuration data can be read from memory (e.g., from an external PROM) or written into the programmable IC 502 by an external device. In some implementations, configuration data may be loaded into configuration memory cells by a configuration controller 534 included in the programmable logic sub-system 530. In some other implementations, the configuration data may be loaded into the configuration memory cells by a start-up process executed by the processor sub-system 510.

The programmable IC 502 may include various circuits to interconnect the processing sub-system 510 with circuitry implemented within the programmable logic sub-system 530. In this example, the programmable IC 502 includes a core switch 526 that can route data signals between various data ports of the processing sub-system 510 and the programmable logic sub-system 530. The core switch 526 may also route data signals between either of the programmable logic or processing sub-systems 510 and 530 and various other circuits of the programmable IC, such as an internal data bus. Alternatively or additionally, the processing sub-system 510 may include an interface to directly connect with the programmable logic sub-system—bypassing the core switch 526. Such an interface may be implemented, for example, using the AMBA AXI Protocol Specification (AXI) as published by ARM.

In some implementations, the processing sub-system 510 and the programmable logic sub-system 530 may also read or write to memory locations of an on-chip memory 522 or off-chip memory (not shown) via memory controller 521. The memory controller 521 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 521 is able to communicate is provided for purposes of illustration only and is not intended as a limitation or to be exhaustive. As shown in FIG. 5, the programmable IC 502 may include a memory management unit 520 and translation look-aside buffer 524 to translate virtual memory addresses used by the sub-systems 510 and 530 to physical memory addresses used by the memory controller 521 to access specific memory locations.

In this example, the programmable IC includes an I/O sub-system 550 for communication of data with external circuits. The I/O sub-system 550 may include various types of I/O devices or interfaces including for example, flash memory type I/O devices, higher performance I/O devices, lower performance interfaces, debugging I/O devices, and/or RAM I/O devices.

The I/O sub-system 550 may include one or more flash memory interfaces 560 illustrated as 560A and 560B. For example, one or more of flash memory interfaces 560 can be implemented as a Quad-Serial Peripheral Interface (QSPI) configured for 4-bit communication. One or more of flash memory interfaces 560 can be implemented as a parallel 8-bit NOR/SRAM type of interface. One or more of flash memory interfaces 560 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 550 can include one or more interfaces 562 providing a higher level of performance than flash memory interfaces 560. Each of interfaces 562A-562C can be coupled to a DMA controller 564A-564C respectively. For example, one or more of interfaces 562 can be implemented as a Universal Serial Bus (USB) type of interface. One or more of interfaces 562 can be implemented as a gigabit Ethernet type of interface. One or more of interfaces 562 can be implemented as a Secure Digital (SD) type of interface. One or more of interfaces 562 can be implemented as a PCIe interface.

The I/O sub-system 550 may also include one or more interfaces 566 such as interfaces 566A-566D that provide a lower level of performance than interfaces 562. For example, one or more of interfaces 566 can be implemented as a General Purpose I/O (GPIO) type of interface. One or more of interfaces 566 can be implemented as a Universal Asynchronous Receiver/Transmitter (UART) type of interface. One or more of interfaces 566 can be implemented in the form of a Serial Peripheral Interface (SPI) bus type of interface. One or more of interfaces 566 can be implemented in the form of a Controller-Area-Network (CAN) type of interface and/or an $I^2C$ type of interface. One or more of interfaces 566 also can be implemented in the form of a Triple Timer Counter (TTC) and/or a Watchdog Timer (WDT) type of interface.

The I/O sub-system 550 can include one or more debug interfaces 568 such as processor JTAG (PJTAG) interface 568A and a trace interface 568B. PJTAG interface 568A can provide an external debug interface for the programmable IC 502. Trace interface 568B can provide a port to receive debug, e.g., trace, information from the processing sub-system 510 or the programmable logic sub-system 530.

As shown, each of interfaces 560, 562, 566, and 568 can be coupled to a multiplexer 570. Multiplexer 570 provides a plurality of outputs that can be directly routed or coupled to external pins of the programmable IC 502, e.g., balls of the package within which the programmable IC 502 is disposed. For example, I/O pins of programmable IC 502 can be shared among interfaces 560, 562, 566, and 568. A user can configure multiplexer 570, via a configuration data stream to select which of interfaces 560-568 are to be used and, therefore, coupled to I/O pins of programmable IC 502 via multiplexer 570. The I/O sub-system 550, may also include a fabric multiplexer I/O (FMIO) interface (not shown) to connect interfaces 562-568 to programmable logic circuits of the programmable logic sub-system. Additionally or alternatively, the programmable logic sub-system 530 can be configured to implement one or more I/O circuits within programmable logic. In this example, the programmable IC 502 includes sub-system 540 having various circuits for power and/or safety management. For example, the sub-system 540 may include a power management unit 546 configured to monitor and maintain one or more voltage domains used to power the various sub-systems of the programmable IC 502. In some implementations, the power management unit 546 may disable power of individual sub-systems, when idle, to reduce power consumption, without disabling power to sub-systems in use.

The sub-system 540 may also include safety circuits to monitor the status of the sub-systems to ensure correct operation. For instance, the sub-system 540 may include one or more real-time processors 542 configured to monitor the status of the various sub-systems (e.g., as indicated in status registers 544). The real-time processors 542 may be configured to perform a number of tasks in response to detecting errors. For example, for some errors, the real-time processors 542 may generate an alert in response to detecting an error. As another example, the real-time processors 542 may reset a sub-system to attempt to restore the sub-system to correct operation. The sub-system 540 includes a switch network 548 that may be used to interconnect various sub-systems. For example, the switch network 548 may be configured to connect the various sub-systems 510, 530, and 540 to various interfaces of the I/O sub-system 550. In some applications, the switch network 548 may also be used to isolate the real-time processors 542 from the sub-systems that are to be monitored. Such isolation may be required by certain application standards (e.g., IEC-61508 SIL3 or ISO-26262 standards) to ensure that the real-time processors 542 are not affected by errors that occur in other sub-systems.

The integrated logic analyzer circuit 580 is configured to probe data of a data bus included in or connected between one or more of the sub-systems 510, 530, 540, or 550 in the programmable IC 502. In some implementations, samples of signals transmitted on the data bus may be provided to the integrated logic analyzer circuit 580 over a signal path 582 through switch 540. Additionally or alternatively, the integrated logic analyzer circuit 580 may receive samples of signals transmitted on the data bus over dedicated signal lines (not shown). The integrated logic analyzer circuit 580 may receive test data input or debug control signals and output sampled data signals via one or more communication circuits in I/O sub-system 550 such as JTAG interface 568. In some implementations, the integrated logic analyzer circuit 580 is coupled to communication circuits in I/O sub-system 550 via a signal path through switch 540. Alternatively or additionally, the integrated logic analyzer circuit 580 may be directly coupled to communication circuits in I/O sub-system 550 via a dedicated signal line (e.g., dashed signal line 584).

Figure 6:
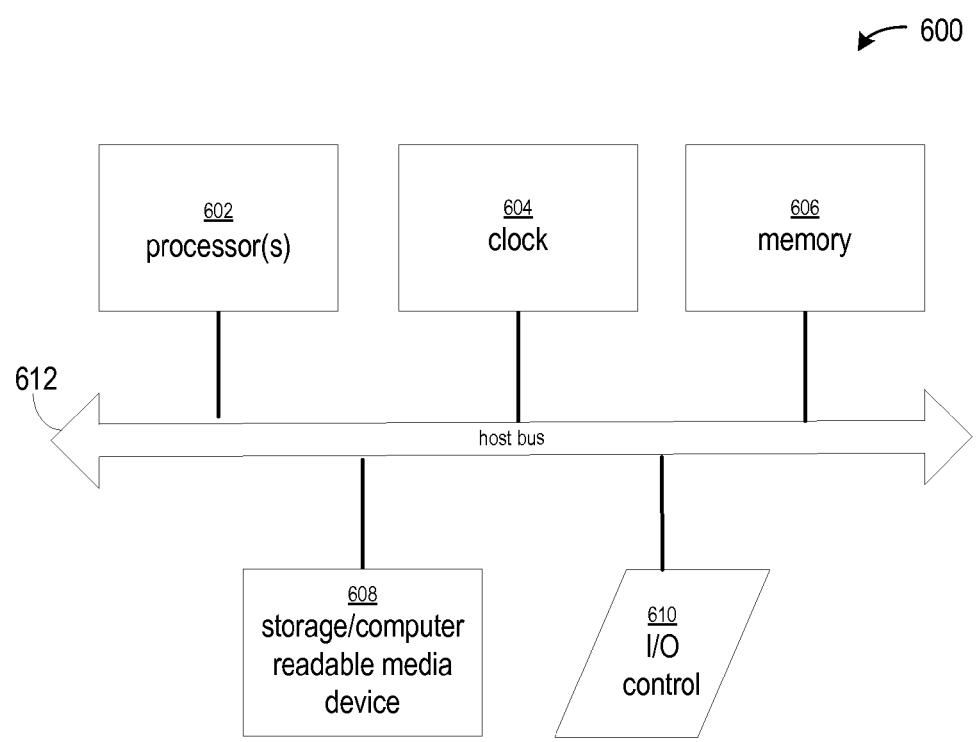
FIG. 6 shows an example of a computing arrangement on which the disclosed processes and data structures may be implemented.

FIG. 6 shows a block diagram of an example computing device that may be configured to implement the data structures and processes described herein. It will be appreciated that various alternative computing devices, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing device 600 includes an arrangement of one or more processors 602, a clock signal generator 604, a memory arrangement 606, a storage arrangement 608, and an input/output control unit 610, all coupled to a host bus 612. The arrangement 600 may be implemented with separate components on a circuit board or may be implemented internally within an integrated circuit. When implemented internally within an integrated circuit, the processor computing device is otherwise known as a microcontroller.

The architecture of the computing device depends on implementation requirements as would be recognized by those skilled in the art. The processor(s) 602 may be one or more general purpose processors, or a combination of one or more general purpose processors and suitable co-processors, or one or more specialized processors (e.g., RISC, CISC, pipelined, etc.).

The memory arrangement 606 typically includes multiple levels of cache memory, and a main memory. The storage arrangement 608 may include local and/or remote persistent storage, such as provided by magnetic disks (not shown), flash, EPROM, or other non-volatile data storage. The storage unit may be read or read/write capable. Further, the memory arrangement 606 and storage arrangement 608 may be combined in a single arrangement.

The processor(s) 602 executes the software in storage arrangement 608 and/or memory arrangement 606, reads data from and stores data to the storage arrangement 608 and/or memory arrangement 606, and communicates with external devices through the input/output control arrangement 610. These functions are synchronized by the clock signal generator 604. The resource of the computing device may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

The disclosed methods and circuits are thought to be applicable to a variety of systems and applications. Other aspects and features will be apparent to those skilled in the art from consideration of the specification. Though aspects and features may in some cases be described in individual figures, it will be appreciated that features from one figure can be combined with features of another figure even though the combination is not explicitly shown or explicitly described as a combination. Various ones of disclosed processes and circuits may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method for testing a partial circuit design including circuit modules having a set of ports configured to be driven by signals from ports of one or more circuits omitted from the partial circuit design, comprising:
   determining the set of ports, in response to input indicating the circuit modules included in the partial circuit design, by identifying ports that are not connected by a net to another port or input/output (I/O) pin in the circuit design and that form inputs to slave circuits in the circuit modules;
   adding a traffic generator circuit to the partial circuit design to form a test circuit design, wherein the traffic generator circuit is configured to provide to the set of ports respective input data signals having a pattern consistent with master-to-slave communication;
   modeling operation of the test circuit design; and
   capturing and storing a set of data signals generated by the circuit modules during the modeled operation of the test circuit design.

2. The method of claim 1, further comprising:
   determining a set of performance metrics for each of the circuit modules, based on the set of data signals; and
   displaying on a user interface the set of performance metrics for each of the circuit modules.

3. The method of claim 2, wherein the set of performance metrics includes latency, timing slack, power consumption, signal jitter, throughput, byte count, beat count, idle cycles, or combinations thereof.

4. The method of claim 1, further comprising:
   instantiating, in the partial circuit design, a monitoring circuit configured to perform the capturing of the set of data signals output by the circuit modules; and
   configuring a set of programmable resources on a target programmable integrated circuit (IC) to implement the monitoring circuit along with the circuit modules and the traffic generation circuit.

5. The method of claim 1, further comprising:
   prompting via a user interface a user to select patterns for the respective input data signals; and
   in response to user input via the user interface specifying a set of patterns, configuring the traffic generation circuit to provide data signals having the set of patterns as the input data signals.

6. The method of claim 5, further comprising:
   identifying slave circuits in the circuit modules of the partial circuit design;
   determining a list of suggested patterns based on the identified slave circuits; and
   wherein the prompting of the user to select patterns for the respective input data signals includes displaying the list of suggested patterns.

7. The method of claim 1, wherein the modeling operation of the test circuit design including the circuit modules of the partial circuit design and the traffic generator circuit includes generating a simulation model for the test circuit design and executing the simulation model.

8. The method of claim 1, wherein the modeling operation of the test circuit design including the circuit modules of the partial circuit design and the traffic generator circuit includes configuring programmable resources of a target programmable integrated circuit (IC) to implement the test circuit design.

9. The method of claim 8, further comprising configuring one or more processor circuits on the target programmable IC to execute a software portion of the partial circuit design.

10. The method of claim 1, wherein the modeling operation of the test circuit design includes:
   generating and executing a model for a first one of the circuit modules of the partial circuit design; and
   configuring programmable resources on a target programmable integrated circuit (IC) to implement a second one of the circuit modules of the partial circuit design.

11. The method of claim 1, wherein in response to a new circuit module being added to the partial circuit design:
   identifying an updated set of ports of the circuit modules that are not connected by a net to another port or I/O pin in the circuit design and that form inputs to slave circuits in the circuit modules; and
   modifying the traffic generator circuit in the test circuit design, wherein the modified traffic generator circuit is configured to provide to the updated set of ports respective input data signals having a pattern characteristic of master-to-slave communication.

12. The method of claim 1, wherein the determining of the set of ports identifies the set of port based on metadata included in the partial circuit design, the metadata specifying configuration of one or more circuit modules included in the partial circuit design.

13. The method of claim 12, further comprising selecting the traffic generator circuit from a library based on the metadata.

14. The method of claim 12, wherein the metadata specifies a schedule for sharing programmable resources, via partial reconfiguration, between two or more circuit modules of the partial circuit design.

15. The method of claim 14, wherein the modeling operation of the partial circuit design including circuit modules of the partial circuit design and the traffic generator circuit includes generating a simulation model configured to simulate a load time and eviction time for partial reconfiguration of the programmable resources.

16. The method of claim 1, further comprising identifying protocol violations in the set of data signals.

17. An apparatus for testing a partial circuit design including circuit modules having a set of ports configured to be driven by signals from ports of one or more circuits omitted from the partial circuit design, comprising a computing arrangement including a processor and memory and configured to:
   determine the set of ports, in response to input indicating the circuit modules included in the partial circuit design, by identifying ports that are not connected by a net to another port or input/output (I/O) pin in the partial circuit design and that form inputs to slave circuits in the circuit modules;
   add a traffic generator circuit to the partial circuit design to form a test circuit design, wherein the traffic generator circuit is configured to provide to the set of ports respective input data signals having a pattern characteristic of master-to-slave communication;
   model operation of a test circuit design; and
   capture and store a set of data signals generated by the circuit modules during the modeled operation of the test circuit design.

18. The apparatus of claim 17, further comprising a programmable integrated circuit (IC) coupled to the computing arrangement; and
   wherein the computing arrangement is configured to, in modeling operation of the test circuit design, configure a set of programmable resources on the programmable IC to implement the circuit modules and the traffic generation circuit.

19. The apparatus of claim 18, wherein the processor is configured to:
   instantiate a monitoring circuit configured to capture the set of data signals and provide the set of data signals to the computing arrangement; and
   configure the set of programmable resources on the programmable IC to implement the monitoring circuit along with the circuit modules and the traffic generation circuit.

20. The apparatus of claim 18, wherein the processor is configured to determine a set of performance metrics for each of the circuit modules, based on the set of data signals, the set of performance metrics including latency, timing slack, power consumption, signal jitter, throughput, byte count, beat count, idle cycles, or combinations thereof.

* * * * *